United States Patent
Rodat et al.

(10) Patent No.: US 7,599,218 B2
(45) Date of Patent: Oct. 6, 2009

(54) PHASE CHANGE MEMORY COMPRISING A LOW-VOLTAGE COLUMN DECODER

(75) Inventors: Christophe Rodat, La Bouilladise (FR); Thierry Giovinazzi, Saint Maximin (FR)

(73) Assignee: STMicroelectronics SA, Montrouge (FR)

( * ) Notice: Subject to any disclaimer, the term of this patent is extended or adjusted under 35 U.S.C. 154(b) by 58 days.

(21) Appl. No.: 11/850,510

(22) Filed: Sep. 5, 2007

(65) Prior Publication Data

US 2008/0062806 A1 Mar. 13, 2008

(30) Foreign Application Priority Data

Sep. 5, 2006 (FR) .................................. 06 07743

(51) Int. Cl.
*G11C 16/04* (2006.01)
(52) U.S. Cl. ............................ 365/185.11; 365/230.03; 365/230.5; 365/231; 365/189.01
(58) Field of Classification Search ............ 365/185.11, 365/230.03, 230.05, 231, 189.01
See application file for complete search history.

(56) References Cited

U.S. PATENT DOCUMENTS 6,122,218 A * 9/2000 Kang ..................... 365/230.05
6,809,984 B2 * 10/2004 Nagano ................. 365/230.05
7,236,393 B2 * 6/2007 Cho et al. ................... 365/163
7,457,152 B2 * 11/2008 Lee et al. .................... 365/163
2004/0027907 A1 2/2004 Ooishi ........................ 365/226
2004/0179398 A1 9/2004 Kleveland et al.
2005/0128799 A1 6/2005 Kurotsuchi et al. ......... 365/163
2005/0185445 A1 8/2005 Osada et al. ................ 365/148
2006/0158929 A1 7/2006 Hidaka

FOREIGN PATENT DOCUMENTS

EP 1 450 373 A1 8/2004
WO 2007/010115 A1 1/2007

* cited by examiner

*Primary Examiner*—Connie C Yoha
(74) *Attorney, Agent, or Firm*—Lisa K. Jorgensen; Robert Iannucci; Seed IP Law Group PLLC

(57) ABSTRACT

An integrated circuit includes a non-volatile memory having memory cells, a memory cell selection circuit having selection blocks, a first device supplying a first voltage applicable to memory cells, a second device supplying a second voltage applicable to memory cells. Each memory cell selection block includes a first selection sub-block to link the memory cell to the first device and a second selection sub-block to link the memory cell to the second device. The first sub-block includes MOS transistors of a first type of conductivity, and the second sub-block includes MOS transistors of a second type of conductivity. Application may be particularly but not exclusively to phase change memories.

34 Claims, 8 Drawing Sheets

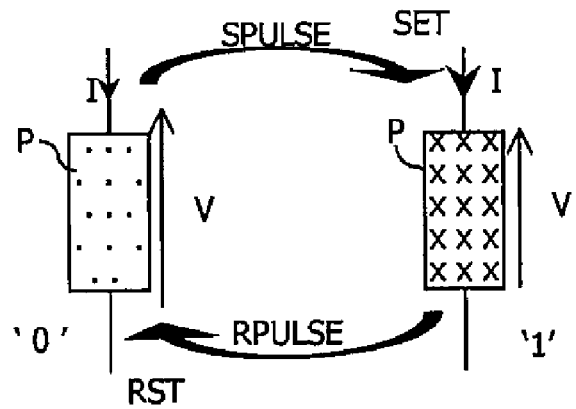
*FIG. 2*
*(Prior Art)*
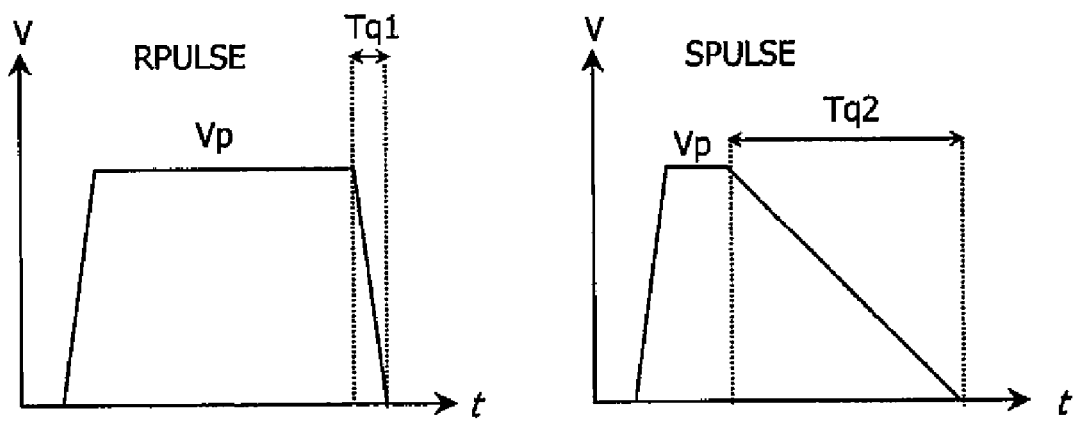
*FIG. 3A*
*(Prior Art)*
*FIG. 3B*
*(Prior Art)*

PHASE CHANGE MEMORY COMPRISING A LOW-VOLTAGE COLUMN DECODER

TECHNICAL FIELD

The present disclosure generally relates to the field of electrically programmable and erasable non-volatile memories and particularly but not exclusively to memories comprising phase change memory cells (PCM).

BACKGROUND INFORMATION

Phase change memory points comprise of a material which can change physical state under the effect of an electric signal, and more precisely under the effect of a temperature rise caused by an electric current passing through it (Joule effect). This state change is remnant and comes with a change in the electrical properties of the memory point. In a first so-called amorphous phase, the material has a high electrical resistivity, and in a second so-called crystalline phase the material has a low electrical resistivity.

Progress made in the compositions of phase change materials, for example chemical element-based alloys in column VI of the Mendeleyev table, such as tellurium Te or selenium Se, are such that the phase change can be obtained with a low-value voltage, for example in the order of 6V, and a current of a few hundred microamperes only, which enables phase change memory points to be integrated into the memories implanted onto semiconductor chips.

As an example, FIG. 1 represents the architecture of a memory array MA of the type described by EP 1 450 373. The memory array MA comprises memory cells CELi,j,k arranged as a matrix and each linked to a word line WLi of rank i and to a bit line BLjk of rank j (j ranging from 0 to m) belonging to a column COLk of rank k. Each memory cell CELi,j,k comprises a selection transistor TS, for example an NMOS transistor, and a phase change memory point P. The anode of the memory point P is linked to a bit line BLjk and its cathode is linked to the ground (or to a switchable ground line) through the selection transistor TS. The gate terminal of the transistor TS is linked to a word line WLi.

As shown in FIG. 2, the memory point P has two stable states SET and RST (short for "RESET") corresponding to the two abovementioned types of resistivity. In the state SET which corresponds for example to the storing of a logic "0", the memory point has a first series resistance, for example 5 to 10 K ohms, while in the state RST corresponding to the storing of a logic "1", the memory point has a second series resistance, for example 100 to 200 K ohms.

The change from the state SET to the state RST (erasing) is ensured by applying to the memory point a voltage pulse RPULSE of the type represented in FIG. 3A, having a voltage plateau Vp of a duration in the order of 100 nanoseconds for example, and a very fast fall time Tq1 in the order of a few nanoseconds. The voltage Vp and the relevant current (a few hundred microamperes) cause a warming by Joule effect which renders the material amorphous (RST state). The change from the state RST to the state SET (programming) is ensured by applying to the memory point a voltage pulse SPULSE of the type represented in FIG. 3B, having a voltage plateau Vp of a duration in the order of 50 nanoseconds for example, and a long fall time Tq2 in the order of 300 nanoseconds for example. The effect of applying such a voltage ramp of duration Tq2 is to have the material recrystallized, while on the contrary the fall time Tq1 of the pulse RPULSE must be very short to prevent the recrystallization.

Reading the memory point P makes it possible to determine whether the latter has the first or the second series resistance. Such a reading is conducted under a low voltage so as not to modify the state of the memory point by causing a spurious erase or programming. For a better understanding, it is accepted that a read voltage Vr in the order of 0.5 V, lower than the threshold voltage of a MOS transistor (generally in the order of 0.7 V), is low enough not to cause a state change in a memory point that is in the erased or programmed state.

The integration of phase change memory points into a CMOS memory on a silicon substrate is an objective for this memory technology to be industrially used, due to the low cost price of CMOS integrated circuits. They comprise transistors of a first type of conductivity and transistors of a second type of conductivity, generally referred to as PMOS and NMOS transistors.

Moreover, the fact that it is possible to erase or program the memory cells with a voltage Vp in the order of 6 V enables a memory devoid of any high-voltage transistors to be envisaged, contrary to FLASH or EEPROM memories using high-voltage floating-gate transistors to control a high erase or programming voltage Vpp in the order of 10 to 15 V.

However, the voltage Vp is close to the maximum voltage that a low-voltage transistor can bear, or "maximum technological voltage Vmax", or even equal to this maximum voltage.

Thus, it is desirable to produce a CMOS technology memory whereby an erase or programming voltage Vp which is close or equal to the maximum technological voltage of the memory can be applied to phase change memory cells, without using any high-voltage transistor.

It is also desirable to be able to apply a low-value read voltage Vr to memory cells, using application means that are simple in structure and inexpensive to produce.

Now, the CMOS memory structures according to prior art do not enable these objectives to be achieved. This will be understood with reference to FIG. 4 which represents a memory architecture of the type described by the application EP 1 450 373. The memory comprises a memory array MA and phase change memory cells of the type described above. The memory also comprises a column selection circuit CSEL1 connected to the bit lines BLjk of the memory array (the bit lines represented being lines BL0k to BLmk of a same column COLk). The selection circuit CSEL1 comprises bit line selection blocks Bjk (B0k... Bmk) with one block per bit line. Each selection block comprises in series two transistors TP1, TP2 of PMOS type and one transistor TN1 of NMOS type. The gate terminals of these transistors are controlled by selection signals YMk, YNk, YOk supplied by a column decoder CDEC1. The gate terminal of the transistor TP1 receives the signal YMk, the gate terminal of the transistor TP2 receives the signal YNk and the gate terminal of the transistor TN1 receives the signal YOk.

During phases of erasing or programming memory cells, the voltage Vp is supplied by erase or programming latches PLTj (PLT0-PLTm) and is applied to the bit lines through the selection transistors TP1, TP2, TN1. For this purpose, the signals YM and YN are set to 0 (ground of the circuit) while the signal YO must be taken to a gate voltage at least equal to Vp+Vth+Vb so that the voltage Vp is transferred without loss, Vth being the threshold voltage of the MOS transistors and Vb the body effect voltage.

Thus, a first disadvantage of this classic memory is that the signal YO must be boosted. If the voltage Vp is equal to the maximum technological voltage Vmax, the supply of the signal YO equal to Vp+Vth+Vb (i.e., Vmax+Vth+Vb) is not possible or requires high-voltage transistors in the column decoder CDEC1 as well as a charge pump (booster circuit) to supply the voltage Vp+Vth+Vb.

During phases of reading memory cells, sense amplifiers SAMPj (SAMP0-SAMPm) supply a voltage Vbl which is applied to the bit lines through the selection transistors TP1, TP2, TN1. This voltage is limited by the transistor TN1 by adjusting the gate voltage of this transistor in the vicinity of the value Vr+Vth+Vb, so that the memory cells only receive the read voltage Vr. Now, an accurate control of the voltage level of the selection signal Y0 is incompatible with the production of a column decoder that is simple in structure and inexpensive, delivering binary signals.

Another known solution to read a phase change memory point involves using a sense amplifier supplying a read voltage Vbl equal to Vr, for example a sense amplifier as described in the application PCT/FR2006/001686. However, in this case, the read voltage Vr, for example 0.5 V, must be able to be transferred without attenuation by the transistors TP1, TP2, TN1. This requires taking the signals YM, YN which control the gate terminals of the transistors TP1, TP2 to a negative value equal to or lower than −(Vth+Vp) Negative voltage charge pumps must thus be provided, which further complicates the architecture of the column decoder CDEC1. The gate terminals of isolation transistors TI which link the erase or programming latches to the bit lines must also receive a negative voltage.

BRIEF SUMMARY

Therefore, one embodiment of the present invention provides a memory structure which enables an erase or programming voltage Vp to be applied to memory cells without having to use high-voltage transistors or having to supply control voltages greater than the voltage Vp.

One embodiment of the present invention also provides a memory structure which enables a read voltage of a value lower than a MOS transistor threshold voltage to be applied to the memory cells, without having to apply negative voltages to gate terminals of transistors.

For this purpose, one embodiment of the present invention provides an integrated circuit including a non-volatile memory having memory cells, a memory cell selection circuit having memory cell selection blocks each including MOS-type selection transistors, a first device supplying a first voltage applicable to memory cells, a second device supplying a second voltage applicable to memory cells, wherein each block for selecting a memory cell includes in parallel a first selection sub-block to link the memory cell to the first device and a second selection sub-block to link the memory cell to the second device, the first sub-block includes MOS transistors of a first type of conductivity, and the second sub-block includes MOS transistors of a second type of conductivity.

According to one embodiment, the integrated circuit comprises a memory cell address decoder supplying the gate terminals of the transistors of the first and second sub-blocks of the selection blocks with memory cell selection signals biased such that, when a memory cell must be selected, the first sub-block of the selection block for selecting the memory cell is in the on state and the second sub-block of the selection block is in the off state or vice-versa, depending on whether the memory cell must be linked to the first or to the second device.

According to one embodiment, the first sub-block and the second sub-block of each selection block are controlled by identical selection signals.

According to one embodiment, the address decoder comprises an address decoding stage supplying first logic selection signals according to a memory cell address, and an adaptation stage receiving a control signal and supplying second logic selection signals that vary according to the first selection signals, the second selection signals being applied to the first and second sub-blocks of the selection blocks as selection signals, the adaptation stage being arranged for the second selection signals to have a logic value that is the opposite of that of the first selection signals when the control signal has a first value and a logic value identical to that of the first selection signals when the control signal has a second value.

According to one embodiment, each memory cell is linked to the first device by a path having the transistors of the first sub-block of a memory cell selection block and one or more additional transistors in series with the transistors of the first sub-block, and is linked to the second device by a path having the transistors of the second sub-block of the memory cell selection block and one or more additional transistors in series with the transistors of the second sub-block, the additional transistor(s) in series with the first sub-block is or are of the same type of conductivity as the transistors of the first sub-block, and the additional transistor(s) in series with the second sub-block of the selection block is or are of the same type of conductivity as the transistors of the second sub-block.

According to one embodiment, the first device supplies an erase or programming voltage for erasing or programming a memory cell and the transistors of the first type are PMOS transistors.

According to one embodiment, the second device supplies a read voltage for reading a memory cell and the transistors of the second type are NMOS transistors.

According to one embodiment, the first device supplies a voltage equal or close to a maximum technological voltage that a low-voltage MOS transistor can bear, and the transistors of the first type are PMOS transistors.

According to one embodiment, the second device supplies a voltage lower than the threshold voltage of a MOS transistor, and the transistors of the second type are NMOS transistors.

According to one embodiment, the integrated circuit having a memory array in which the memory cells are linked to bit lines, and in which the memory cell selection circuit is a bit line selection circuit including, for each selectable bit line, a bit line selection block having in parallel a first sub-block to link the bit line to the first device and a second sub-block to link the bit line to the second device, the first sub-block having transistors of a first type of conductivity, and the second sub-block having transistors of a second type of conductivity.

According to one embodiment, the bit line selection circuit is split into two parts arranged on either side of the memory array, the first part including the first sub-blocks of the selection blocks and the second part including the second sub-blocks of the selection blocks, the first sub-blocks being linked to first ends of bit lines and the second sub-blocks being linked to second ends of bit lines.

According to one embodiment, the first and the second sub-blocks of a selection block each only comprise a single transistor.

According to one embodiment, the first and the second sub-blocks of a selection block each comprise at least two transistors in series.

According to one embodiment, the integrated circuit comprises phase change memory points.

One embodiment of the present invention also relates to a method for applying to memory cells a first voltage and a second voltage, through a memory cell selection circuit including memory cell selection blocks each having MOS-type selection transistors, the method comprising providing in each memory cell selection block a first selection sub-block and a second selection sub-block in parallel, the first sub-block having MOS transistors of a first type of conductivity, and the second sub-block having MOS transistors of a second type of conductivity, applying the first voltage to the memory cells through the first sub-blocks of the selection blocks, and applying the second voltage to the memory cells through the second sub-blocks of the selection blocks.

According to one embodiment, the method comprises applying to the gate terminals of the transistors of the first and second sub-blocks of the selection blocks, memory cell selection signals biased such that, when a memory cell must be selected, the first sub-block of the selection block for selecting the memory cell is in the on state and the second sub-block of the selection block is in the off state or vice-versa, depending on whether the memory cell must be linked to the first or to the second device.

According to one embodiment, the method comprises controlling the first sub-block and the second sub-block of each selection block by using the identical selection signals.

According to one embodiment, the method comprises: supplying first logic selection signals according to a memory cell address, supplying second logic selection signals having a logic value that is the opposite of that of the first selection signals or a logic value identical to that of the first selection signals depending on whether the memory cells must receive the first voltage or the second voltage, and applying the second selection signals to the first and second sub-blocks of the selection blocks as selection signals.

According to one embodiment, the method comprises: applying the first voltage to memory cells through the transistors of the first sub-block of a memory cell selection block and through one or more additional transistors in series with the transistors of the first sub-block and of the same type of conductivity as the transistors of the first sub-block, and applying the second voltage to memory cells through the transistors of the second sub-block of the memory cell selection block and through one or more additional transistors in series with the transistors of the second sub-block and of the same type of conductivity as the transistors of the second sub-block.

According to one embodiment, the first voltage is an erase or programming voltage for erasing or programming a memory cell and the transistors of the first type are PMOS transistors.

According to one embodiment, the second voltage is a read voltage for reading a memory cell and the transistors of the second type are NMOS transistors.

According to one embodiment, the first voltage is equal or close to a maximum technological voltage that a low-voltage MOS transistor can bear, and the transistors of the first type are PMOS transistors.

According to one embodiment, the second voltage is lower than the threshold voltage of a MOS transistor, and the transistors of the second type are NMOS transistors.

According to one embodiment, the method is applied to a memory array wherein the memory cells are linked to bit lines, and comprises: arranging the first sub-blocks of the selection blocks on one side of the memory array and linking them to first ends of bit lines, and arranging the second sub-blocks on another side of the memory array and linking them to second ends of bit lines.

According to one embodiment, the method comprises providing only a single transistor in the first and the second sub-blocks of a selection block.

According to one embodiment, the method comprises providing at least two transistors in series in the first and the second sub-blocks of a selection block.

According to one embodiment, the first voltage is an erase or programming voltage for erasing or programming phase change memory points and the second voltage is a read voltage for reading phase change memory points.

BRIEF DESCRIPTION OF THE SEVERAL VIEWS OF THE DRAWINGS

Examples of non-exhaustive and non-limiting implementation embodiments of the present invention will be described below in relation with, but not limited to, the following figures, in which.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
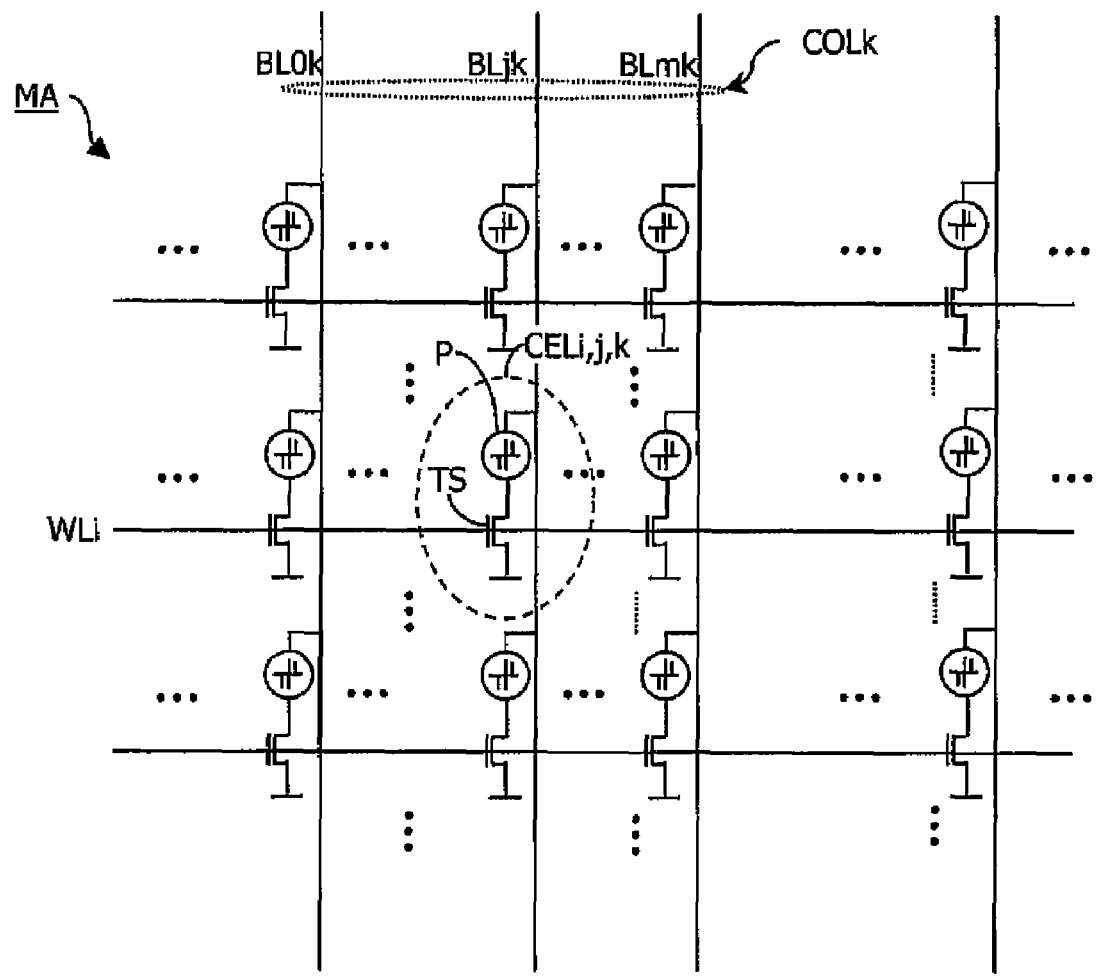
FIG. 1 described above represents a memory array comprising phase change memory cells, FIG. 2 described above represents a phase change memory point in the erased state and the programmed state, FIGS. 3A and 3B described above represent phase change signals applied to a memory point, FIG. 4 described above schematically represents a classic phase change memory architecture, FIG. 5 schematically represents an example of an embodiment of a phase change memory according to the present invention.
Figure 4:
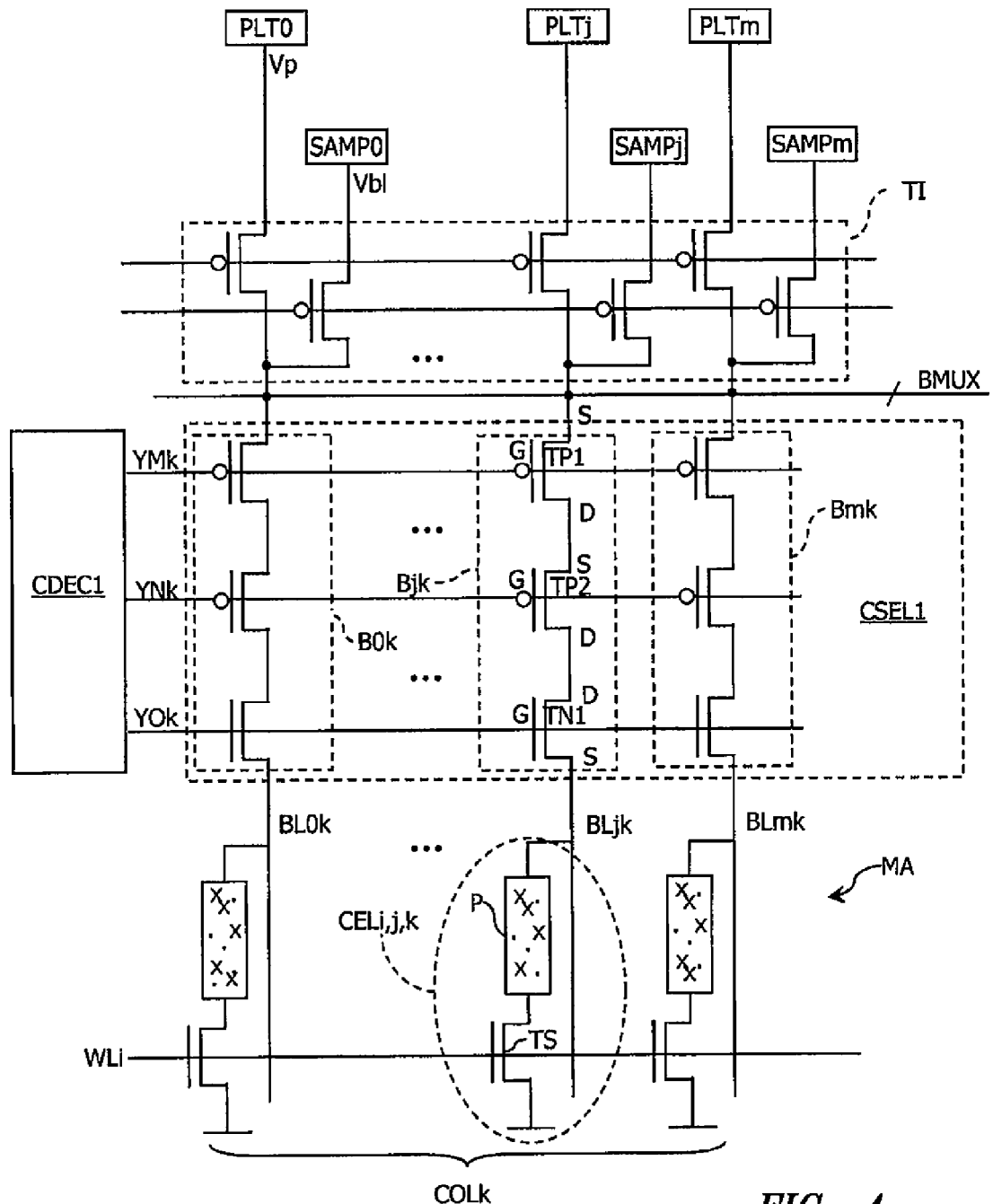
Figure 5:
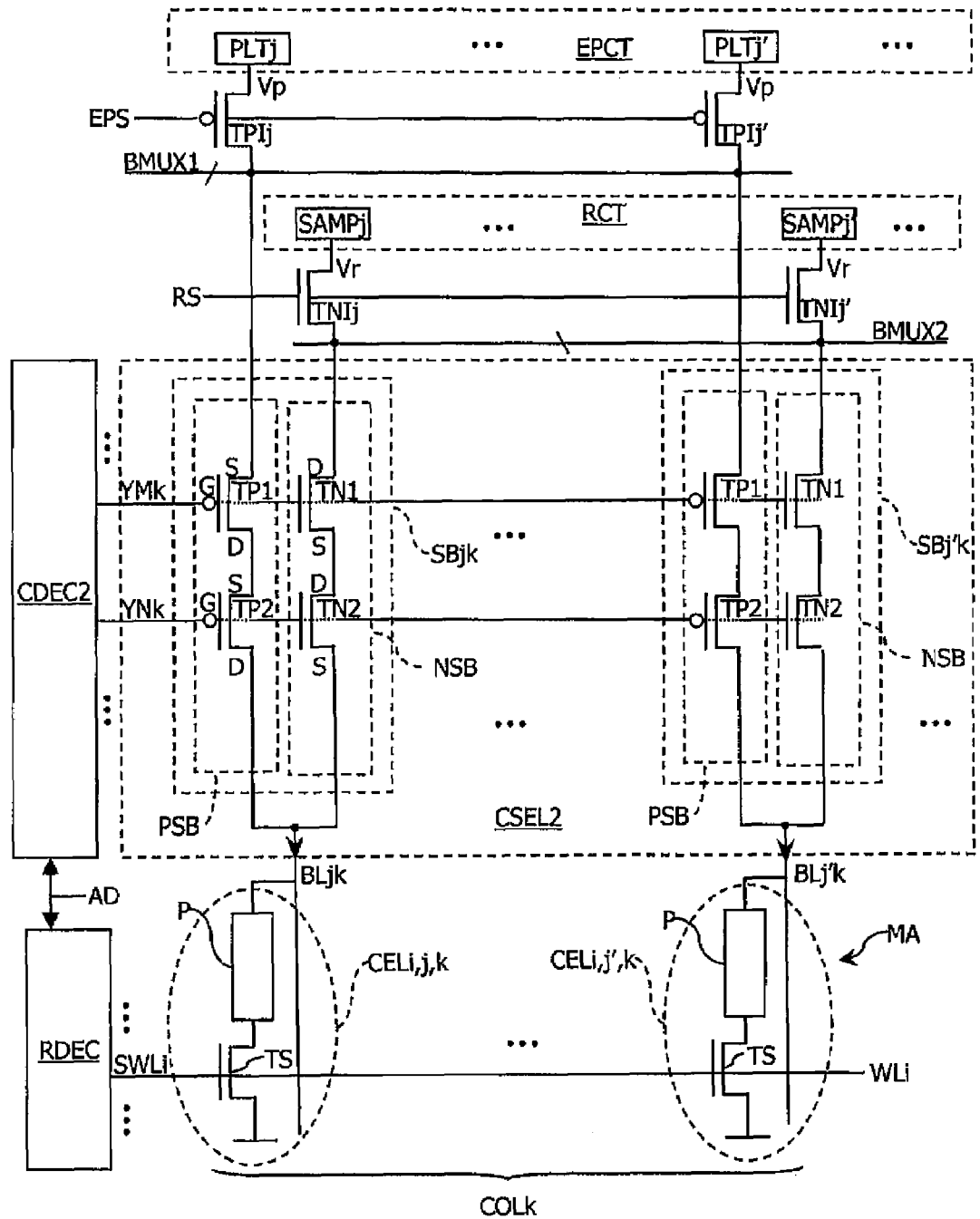

FIG. 5 schematically represents a memory architecture according to one embodiment of the present invention. The memory comprises a memory array MA of the same type as that represented in FIG. 1. For the sake of readability of the figure, only the following elements of the memory array are represented:

- a word line WL of rank i (WLi),
- two bit lines BL of rank j and j' (BLjk, BLj'k) belonging to a column COL of rank k (COLk), and
- two memory cells CEL (CELi,j,k, CELi,j',k) respectively linked to the bit line BLjk and to the bit line BLj'k, and linked to the same word line WLi. Each memory cell comprises a selection transistor TS and a phase change memory point P.

Elements of rank i, j, j', k linked to the word line WLi or to the bit lines BLjk, BLj'k are also represented.

The memory also comprises a row decoder RDEC, a column decoder CDEC2, a column selection circuit CSEL2, a read circuit RCT and an erase or programming circuit EPCT. The decoder RDEC and the decoder CDEC2 respectively receive the most and least significant bits of an address AD of a memory word to be selected (words of 8 memory cells or more according to the number of bit lines per column). The decoder RDEC supplies word line WL selection signals SWL (SWLi). The decoder CDEC2 supplies column selection signals YM, YN with two selection signals (YMk, YNk) per column of rank k (COLk).

The circuit EPCT comprises erase or programming latches PLT (PLTj, PLTj') supplying the erase or programming voltage Vp (RPULSE and SPULSE square waves, such as for example shown in FIG. 3A, 3B). The circuit RCT comprises sense amplifiers SAMP (SAMPj, SAMPj') supplying a low-value read voltage Vr, here lower than the threshold voltage of a MOS transistor, for example 0.5 V as indicated above.

Each latch PLT (PLTj, PLTj') is linked to bit lines of the same rank through an isolation transistor TPI of PMOS type (TPIj, TPIj'), a multiplexing bus BMUX1, and the column selection circuit CSEL2. Each sense amplifier SAMP (SAMPj, SAMPj') is linked to bit lines of the same rank through an isolation transistor TNI (TNIj, TNIj') of NMOS type, a multiplexing bus BMUX2 and the column selection circuit CSEL2 (it will be noted that bit lines of the same rank inevitably belong to columns of different ranks, FIG. 5 only representing bit lines of a same column).

The selection circuit CSEL2 comprises one selection block SB (SBjk, SBj'k) for each bit line BL (BLjk, BLj'k). The bit line selection blocks belonging to a same column COLk (for example the blocks SBjk, SBj'k represented) receive the same selection signals YM, YN (for example the signals represented YMk, YNk).

Structure of the Selection Blocks

According to one embodiment of the present invention, each selection block SB comprises two selection sub-blocks PSB and NSB. The sub-block PSB only comprises transistors of a first type of conductivity arranged in series, here PMOS transistors. The sub-block NSB only comprises transistors of a second type of conductivity arranged in series, here NMOS transistors.

More particularly, each sub-block NSB here comprises two NMOS transistors TN1, TN2 in series and each sub-block PSB comprises two PMOS transistors TP1, TP2 in series. The sub-blocks NSB, PSB of a same selection block are arranged in parallel, the sub-block PSB linking the concerned bit line BL to the corresponding erase or programming latch PLT, and the sub-block NSB linking the concerned bit line to the corresponding sense amplifier SAMP.

Moreover, the sub-blocks NSB, PSB of a same bit line selection block are controlled here by the same signals. Thus, the transistors TN1 and TP1 receive the signal YM on their gate terminal and the transistors TN2 and TP2 receive the signal YN on their gate terminal.

In summary for one embodiment, each bit line BL is linked to the programming latch PLT by an electrical path comprising for example only PMOS transistors, here the two transistors of the selection sub-block PSB and the isolation transistor TPI. Similarly, each bit line BL is linked to the sense amplifier SAMP by an electrical path comprising for example only NMOS transistors, here two transistors of the selection sub-block NSB and the isolation transistor TNI.

Control of the Selection Blocks

Figure 6:
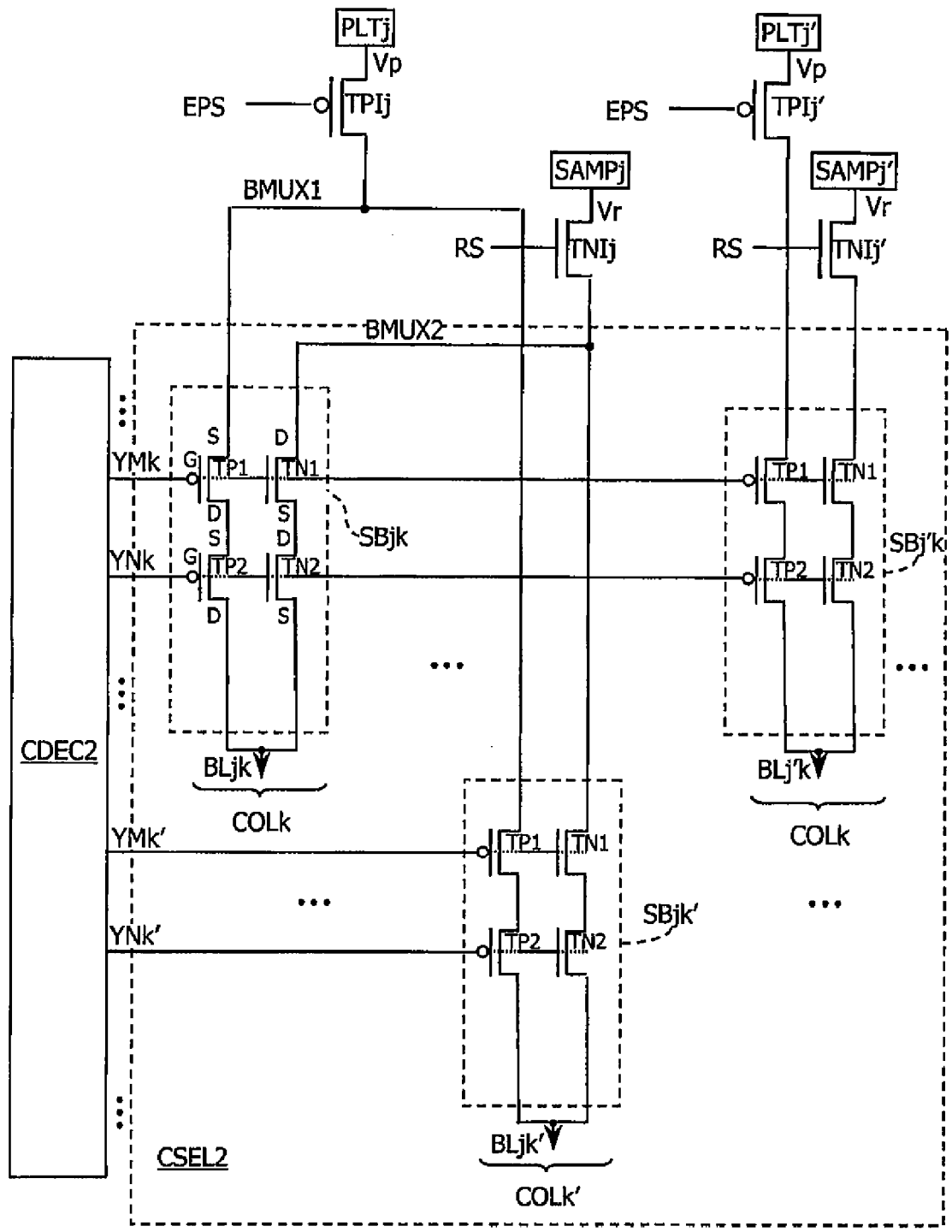
FIG. 6 represents in greater detail certain elements of an embodiment of the memory in FIG. 5.

An example of controlling the selection blocks by using the selection signals YM, YN will now be described in relation with FIG. 6. FIG. 6 represents, in addition to the elements already represented in FIG. 5, a bit line BLjk' of rank j belonging to a column COLk' of rank k' and the elements associated to this bit line, e.g., a selection block SBjk' for selecting the bit line and corresponding selection signals YMk', YNk'. The bit line BLjk' is linked to the latch PLTj through the transistors TP1, TP2 of the block SBjk' and the isolation transistor TPIj. It is also linked to the sense amplifier SAMPj via the transistors TN1, TN2 of the block SBjk' and the isolation transistor TNIj.

It is assumed here that the column of rank k is first erase- or program-selected, then read-selected, and that the memory cells concerned are for example those belonging to the word line WLi represented in FIG. 5 (FIGS. 5 and 6 completing each other). To erase- or program-select these memory cells, or to read-select them, the selection signal SWLi of the word line is set to 1. This logic selection value is for example equal to a supply voltage Vcc of the memory, for example 3 V, both during erasing or programming phases and reading phases. The voltage Vcc puts the selection transistor TS into the on state. The memory point P is then passed through by an erase or programming current equal to the voltage Vp divided by the series resistance of the memory point, or by a read current equal to the voltage Vr divided by the series resistance of the memory point.

Erasing or Programming Phases

During the erasing or programming phases, the logic "1" corresponds to the erase or programming voltage Vp, which is used to electrically supply the decoder CDEC2 or at least output stages thereof ("driver" stages).

The selection signals YMk, YNk for selecting the column of rank k are set to 0 (ground) while the selection signals YMk', YNk' for selecting the column of rank k' are set to 1. All the isolation transistors TPI are put into the on state by using a gate control signal EPS equal to 0 while all the isolation transistors TNI are put into the off state by means of a gate control signal RS equal to 0. The latches PLTj, PLTj' supply the voltage Vp (assuming that all the memory cells belonging to the column of rank k and to the word line WLi are to be erased or to be programmed).

The transistors TP1, TP2 of the blocks SBjk, SBj'k receive the voltage Vp on their source terminal (S). Their gate terminal (G) is set to 0 by the column decoder CDEC2. These PMOS transistors are thus in the on state and transfer the voltage Vp to their drain terminal (D) without losing voltage at their terminals since their source-gate voltage is greater than their threshold voltage Vth. Simultaneously, the transistors TN1, TN2 of the blocks SBjk, SBj'k are in the off state since their gate terminal (G) is also maintained on 0.

Thus, during the erasing or programming phases, it is not necessary for the decoder CDEC2 to supply selection signals greater than the voltage Vp. The supply of zero-value signals YMk, YNk (and more generally of a voltage lower than Vp−Vth) is sufficient to transfer the voltage Vp to the memory cells concerned.

At the same time, the block SBjk' receives the selection signals YMk', YNk' equal to 1, such that the PMOS transistors of this selection block are in the off state. The other bit line selection blocks of the circuit CSEL2 also receive selection signals equal to 1 which maintain their respective PMOS transistors in the off state. Thus, only the bit lines of the column COLk selected receive the erase or programming voltage Vp, particularly the bit lines BLjk, BLj'k represented in the figure.

Reading Phases

During the reading phases, the logic "1" supplied by the decoder CDEC2 corresponds to the voltage Vcc, used to electrically supply the decoder CDEC2.

The selection signals YMk, YNk for selecting the column of rank k are set to 1 while the selection signals YMk', YNk' for selecting the column of rank k' are set to 0. The isolation transistors TPIj are put into the off state by the signal EPS (EPS=1) while the isolation transistors TNIj are put into the on state by the signal RS (RS=1). The sense amplifiers SAMPj, SAMPj' supply the voltage Vr.

The transistors TN1, TN2 of the blocks SBjk, SBj'k receive the voltage Vr on their drain terminal (D) and their gate terminal (G) is set to 1 by the column decoder CDEC2. These transistors are thus both in the on state and transfer the voltage Vr to their source terminal (S) without losing voltage at their terminals since their gate-source voltage is greater than their threshold voltage Vth (the voltage Vr being much lower than the voltage Vcc).

Thus, during the reading phases, it is not necessary for the decoder CDEC2 to supply selection signals modulated in the vicinity of the value Vr+Vth+Vb or to supply gate control signals of negative value. The supply of signals YMk, YNk of logic value 1 corresponding for example to the voltage Vcc (and more generally of logic signals of a voltage greater than Vr+Vth+Vb) enables the voltage Vr to be transferred to the memory cells concerned, without losing voltage.

At the same time, the selection block SBjk' receives selection signals YMk', YNk' equal to 0, such that the NMOS transistors of this block are in the off state. The other bit line selection blocks also receive selection signals equal to 0 which block the NMOS transistors. Thus, only the bit lines of the column COLk selected receive the read voltage Vr, particularly the bit lines BLjk, BLj'k represented in the figure.

In summary, the memory according to one embodiment of the present invention comprises two distinct paths to link the bit lines to the latches (or any other element supplying the erase or programming voltage Vp) and to the sense amplifiers. The electrical path leading to the latches comprises exclusively for example of PMOS transistors (including the isolation transistors TPI) and enables the voltage Vp to be transferred by applying to the gate terminals of these various transistors a zero voltage or a voltage at least lower than Vp−Vth−Vb. The electrical path leading to the sense amplifiers comprises exclusively for example of NMOS transistors (including the isolation transistors TNI) and enables the voltage Vr to be transferred by applying to the gate terminals of these various transistors a non-modulated voltage greater than Vr+Vth+Vb, the simplest solution, as indicated above, being to use the logic level 1 which generally corresponds to the supply voltage Vcc of the memory.

As the PMOS transistors of the bit line selection blocks transfer a high current during the erasing or programming phases, for example 700 microamperes, these transistors have more generous dimensions than the NMOS transistors which only have to transfer a low read current, for example 10 microamperes. Thus, the PMOS transistors have a gate width-to-length ratio (W/L) higher than the NMOS transistors.

Equivalent Diagram

Figure 7:
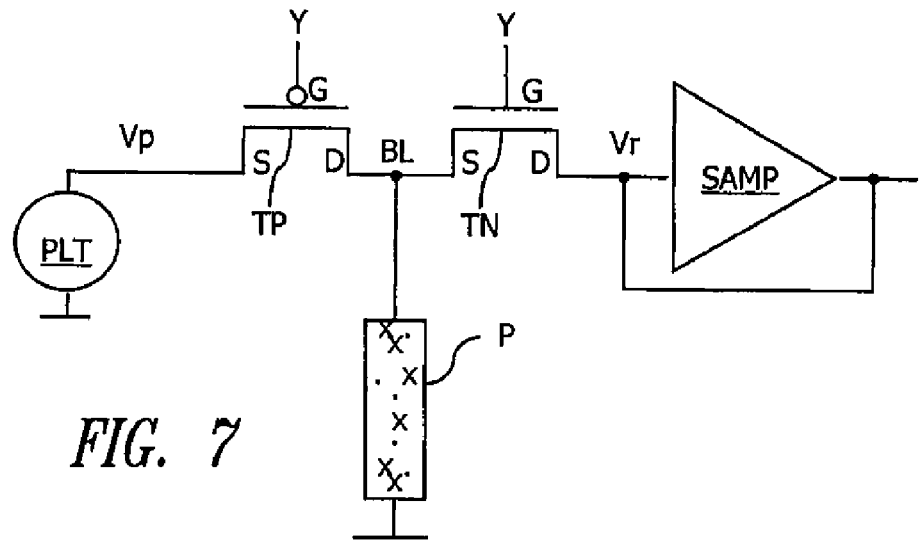
FIG. 7 is an equivalent diagram of an embodiment of the memory in FIG. 5, reduced to a memory point.

FIG. 7 is an equivalent diagram of the memory described above reduced to a memory cell. The memory cell comprises a memory point P and a selection transistor which is assumed to be in the on state and is not therefore represented. The memory point P is linked to a node BL representing a bit line and the node BL is linked firstly to an erase or programming latch PLT, through a PMOS transistor TP, and also to a sense amplifier SAMP, through an NMOS transistor TN. The transistors TP and TN are driven by the same selection signal Y. Thus, when Y=0, the memory point is linked to the latch PLT and receives the voltage Vp supplied by the latter and when Y=1, the memory point is connected to the amplifier SAMP and receives the read voltage Vr supplied by the latter.

It shall be noted that FIG. 7 can also be the "true" diagram (not the equivalent), reduced to a memory cell, of a memory according to one embodiment of the present invention devoid of any isolation transistors and in which the bit line selection blocks each only comprise one PMOS transistor in parallel with an NMOS transistor (which requires the decoder CDEC2 to supply only one selection signal per column). Generally speaking, the number of PMOS or NMOS transistors that each bit line selection block comprises can be variable according to the degree of decoding implemented in the column decoder CDEC2. Each selection block can comprise two or three, or even four transistors in series of each type, but a single transistor of each type is also possible.

Aspects of the Present Invention Relating to the Column Address Decoding

The use of the same selection signals YM, YN to drive both the NMOS and PMOS transistors of the bit line selection blocks is an advantageous feature of one embodiment of the present invention which avoids producing a dual decoder that would include two column decoders in parallel, one controlling the PMOS transistors and the other controlling the NMOS transistors of the bit line selection blocks.

However, this means that, when the PMOS transistors of the bit line selection blocks belonging to unselected columns are in the off state, the NMOS transistors are in the on state, and vice-versa. It should consequently be noted that this is in no way problematic since the isolation transistors TNI or TPI prevent the unselected bit lines from being linked to the sense amplifiers (in read mode) or to the latches (in erase or programming mode). In addition, these isolation transistors are optional and can be removed if the sense amplifiers and the latches are designed for their input or output terminal to have a high impedance outside the read periods, respectively outside the erasing or programming periods.

Moreover, using the same selection signals YM, YN to drive both the NMOS and PMOS transistors of the selection blocks means that the logic value of these signals must be inverted between the erasing or programming phases and the reading phases.

Figure 8:
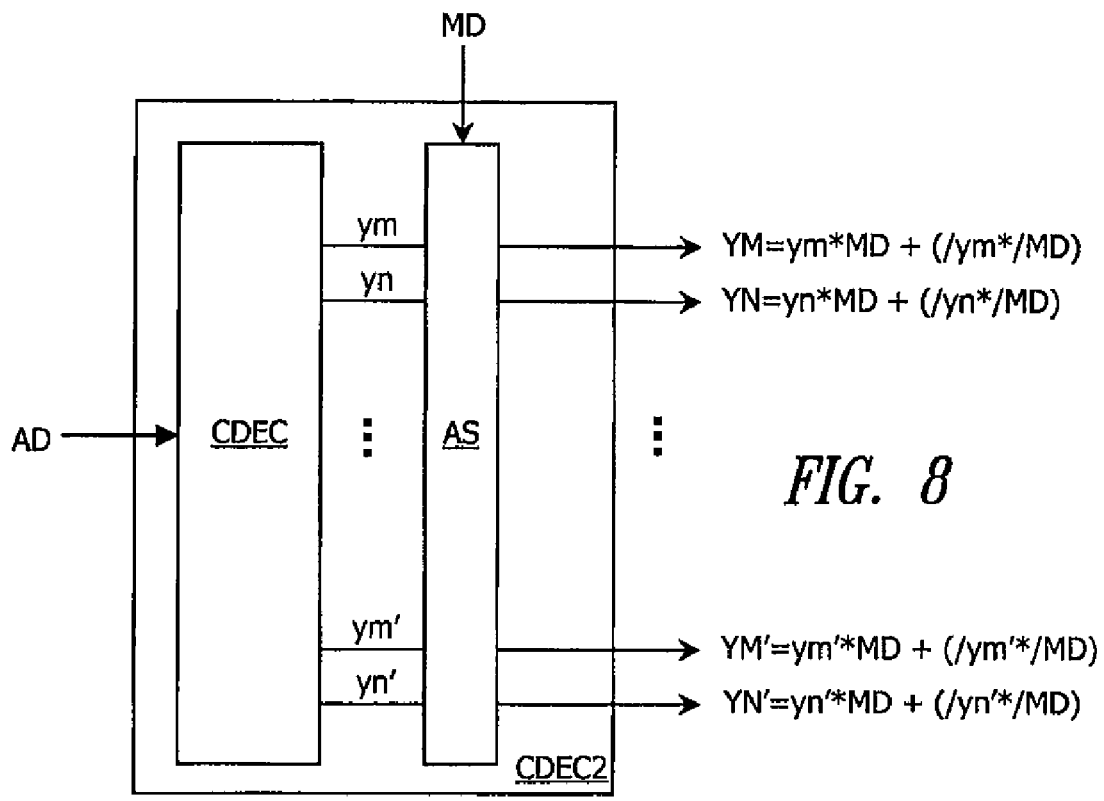
FIG. 8 represents an example of an embodiment of a column decoder present in the memory in FIG. 5.

FIG. 8 represents an embodiment of the column decoder CDEC2 enabling this feature to be implemented without the need to produce a dual decoder. The decoder CDEC2 comprises a decoding stage CDEC that is classic per se and of the same structure as a classic column decoder, supplying logic column selection signals ym, yn, ym', yn', etc. These signals are applied to an adaptation stage AS that supplies the selection signals YM, YN, YM', YN' used by an embodiment of the present invention according to a signal MD and according to the signals ym, yn, ym', yn'. The signal MD is for example equal to 0 during the erasing or programming phases and to 1 during the reading phases. The selection signals supplied by the stage AS are for example equal to:

$$YM=ym*MD+/ym*/MD$$

$$YN=yn*MD+/yn*/MD$$

$$YM'=ym'*MD+/ym'*/MD$$

$$YN'=yn'*MD+/yn'*/MD$$

e.g., when MD=0:

$$YM=/ym$$

$$YN=/yn$$

$$YM'=/ym'$$

$$YN'=/yn'$$

When MD=1:

$$YM=ym$$

$$YN=yn$$

$$YM'=ym'$$

$$YN'=yn'$$

"*" being the AND function, "+" the OR function and "/" the inverting function.

Figure 9:
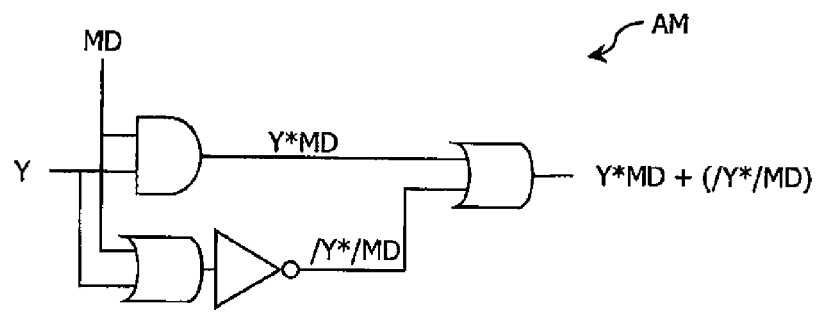
FIG. 9 represents an embodiment of a matching module present in the decoder in FIG. 8.

FIG. 9 shows an example of an embodiment of adaptation modules AM forming the adaptation stage AS and enabling each column selection signal to be inverted or not according to the signal MD in accordance with the logic equations above. The modules AM each comprise two OR gates, an inverting gate and an AND gate. In an equivalent alternative embodiment, these modules are EXCLUSIVE OR gates and thus perform the function:

$$YM=ym*/MD+/ym*MD$$

Aspects of the Present Invention Relating to the Layout of the Components

Figure 10:
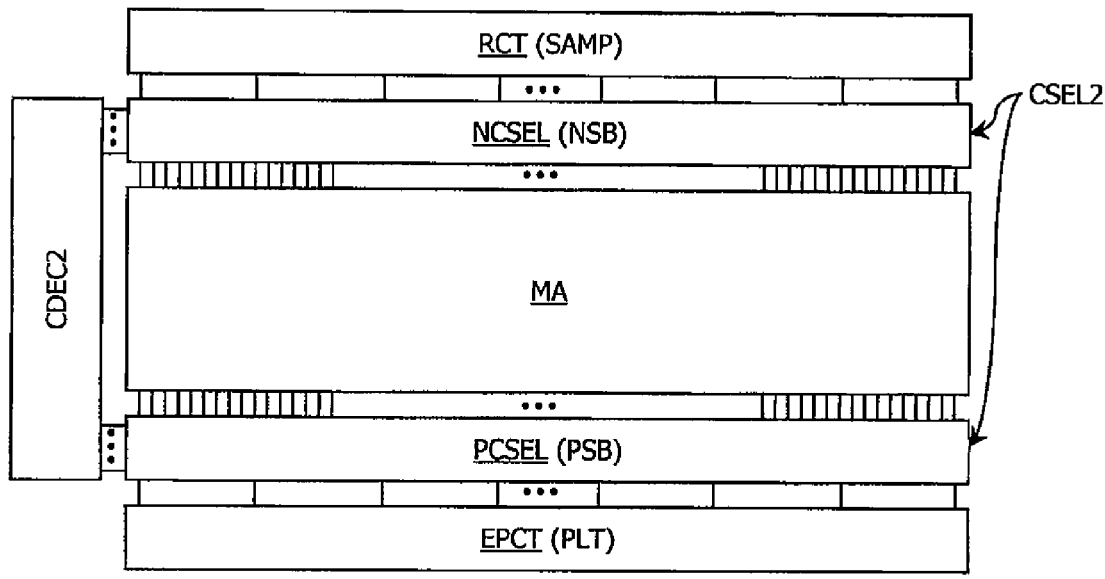
FIG. 10 is a block diagram which shows a second example of an embodiment of a memory according to the present invention.

Another aspect of the present invention relates to the layout of the memory, e.g., the way the PMOS and NMOS transistors are arranged on the surface of a silicon chip. According to this aspect of the present invention, and as shown in FIG. 10, provision is made for:
 arranging the read circuits RCT (amplifiers SAMP) and the erase or programming circuits (latches PLT) on either side of the memory array MA, the circuit RCT being for example arranged "above" the memory array (in the array of the integrated circuit) and the circuit EPCT "below" the memory array (again in the array of the integrated circuit),
 splitting the column selection circuit CSEL2 into two selection semi-circuits NCSEL and PCSEL respectively comprising for example only NMOS transistors (sub-blocks NSB) and PMOS transistors (sub-blocks PSB),
 arranging the semi-circuit NCSEL above the memory array, between the latter and the circuit RCT, and
 arranging the semi-circuit PCSEL below the memory array, between the latter and the circuit EPCT.

Figure 11:
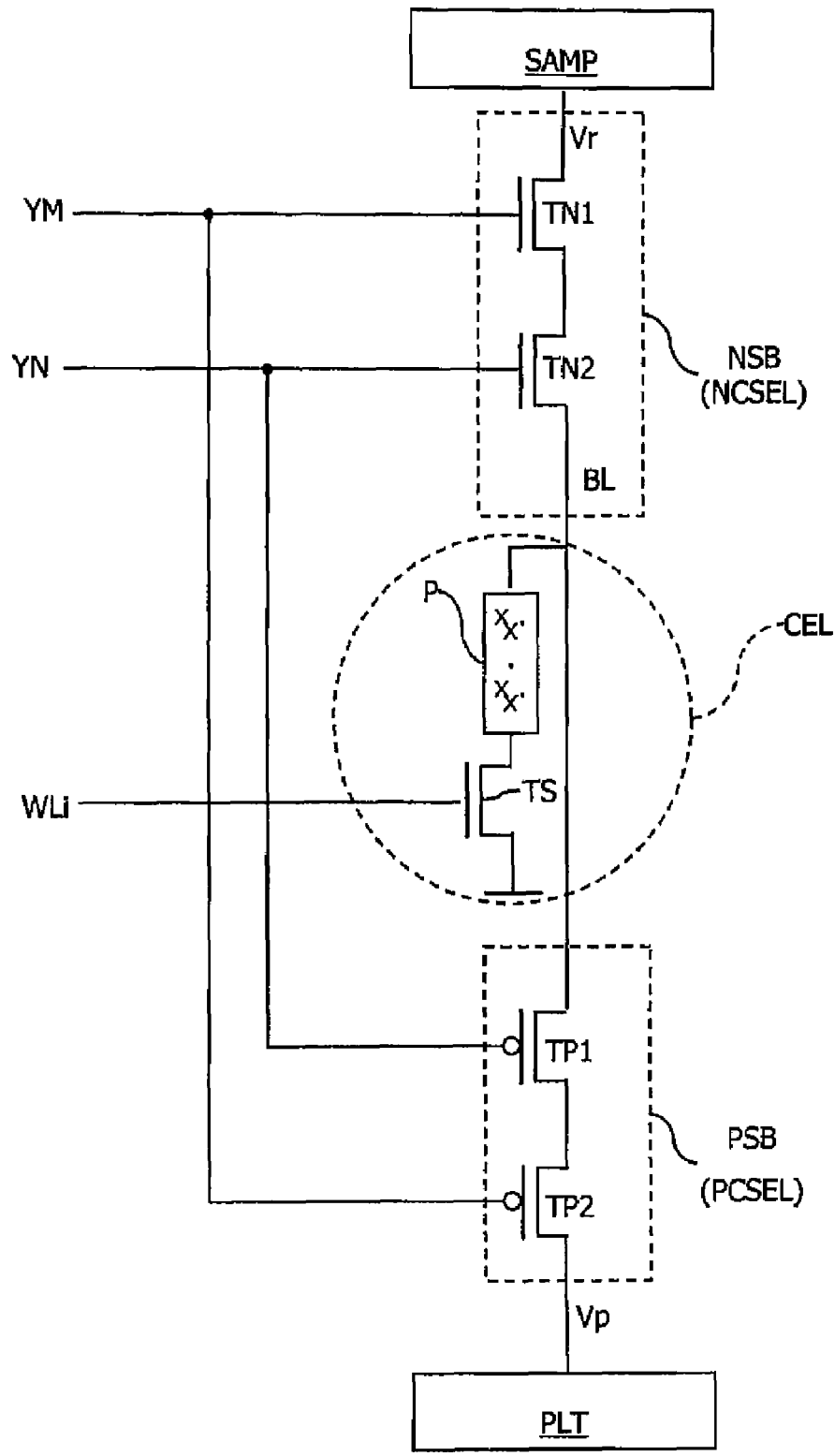
FIG. 11 represents an embodiment of a bit line of the memory in FIG. 10.

A memory structure as represented in greater detail in FIG. 11 is obtained. Each bit line BL (only one bit line being represented) has a first end linked to an amplifier SAMP through a selection sub-block NSB comprising the transistors TN1, TN2, and a second end linked to a latch PLT through a selection sub-block PSB comprising the transistors TP1, TP2 (the isolation transistors and the multiplexing buses not being represented either). This memory structure enables the pitch between the bit lines to be reduced compared to a memory structure as represented in FIG. 5 or 6, wherein the pitch between the bit lines is imposed by the width of the blocks SB, which is significant due to the arrangement of the PMOS and NMOS transistors in parallel.

Variations and Applications of Embodiments of the Present Invention

The present invention is susceptible to various other alternative embodiments, particularly but not exclusively according to the memory array structure chosen.

The memory which has been described above as an example of implementation embodiment of the present invention is a word-erasable and -programmable memory in which the number of bits per word is defined by the number of bit lines contained in one column. In accordance with the common rules of architecture of memories, one embodiment of the present invention can also be applied to a bit-erasable and -programmable memory in which the notion of column is not implemented (e.g., in which a column corresponds to only one bit line). In such an embodiment, the erasing or programming of the memory cells is done individually and sequentially (one after the other). The bit-erasing and the bit-programming can be preferred to the word-erasing or the word-programming according to the technological requirements of the design of the memory, particularly to avoid having to collect a significant resulting current equal to the sum of the erase and programming currents passing through each of the memory cells concerned upon the collective writing of all the memory cells of a word. Thus, a bit-erasable and -programmable memory according to one embodiment of the present invention does not contain any columns unlike a word-erasable and -programmable memory. Such a memory comprises a selection circuit enabling the bit lines to be selected individually instead of a column selection circuit, and the column decoder becomes a bit line decoder (bit line address decoder).

Moreover, a memory according to an embodiment of the present invention may comprise only one word line, the bit lines then no longer being necessary. Such a memory thus comprises a selection circuit enabling memory cells to be directly selected instead of selecting bit lines.

Thus, the essential function of the column selection circuit according to one embodiment of the present invention is to link at least one memory cell to a first device supplying a first voltage, here a read voltage, and to a second device supplying a second voltage, here an erase or programming voltage.

Therefore, various applications of embodiments of the present invention are possible and that the present invention is not limited to phase change memories. Although one embodiment of the present invention has been initially designed to meet the technical problem set forth in the background discussion above, the advantages of various embodiments of the present invention can be sought with other types of memory cells, these advantages being essentially to enable a high-value voltage (Vp) to be applied to the memory cells (via bit lines or not) by using an address decoder supplying selection signals having non-boosted logic voltage levels and without negative value, while enabling a low-value voltage to be applied to the memory cells by using the same address decoder.

Generally speaking, one embodiment of the present invention relates to any type of integrated circuit comprising a memory, from the simple memory sold in the form of an integrated circuit to the complex integrated circuits comprising a memory and various elements using the memory, such as microcontrollers for example.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, Abstract, Figures, and the claims, but should be construed to include all possible embodiments along with the full scope of equivalents to which such claims are entitled. Accordingly, the claims are not limited by the disclosure.

What is claimed is:

1. An integrated circuit having a non-volatile memory, the integrated circuit comprising:
   memory cells;
   a memory cell selection circuit having memory cell selection blocks each including selection transistors;
   a first device to supply a first voltage applicable to said memory cells;
   a second device to supply a second voltage applicable to said memory cells;
   wherein:
      each selection block to select a memory cell includes in parallel a first selection sub-block to link the memory cell to the first device and a second selection sub-block to link the memory cell to the second device;
      the first sub-block only includes transistors of a first type of conductivity;
      the second sub-block only includes transistors of a second type of conductivity;
      each memory cell is linked to the first device by a path having the transistors of the first sub-block of the memory cell selection block and one or more additional transistors in series with the transistors of the first sub-block, and is linked to the second device by a path having the transistors of the second sub-block of the memory cell selection block and one or more additional transistors in series with the transistors of the second sub-block; and
      the additional one or more transistors in series with the first sub-block is or are of same type of conductivity as the transistors of the first sub-block, and the additional one or more transistors in series with the second sub-block of the selection block is or are of same type of conductivity as the transistors of the second sub-block.

2. The integrated circuit according to claim 1, further comprising a memory cell address decoder to supply to gate terminals of the transistors of the first and second sub-blocks of the selection blocks with memory cell selection signals biased such that, when one or more of the memory cells is to be selected, the first sub-block of the selection block to select the memory cell is in an ON state and the second sub-block of the selection block is in an OFF state or vice-versa, depending on whether the memory cell is to be linked to the first or to the second device.

3. The integrated circuit according to claim 2 wherein the first sub-block and the second sub-block of each selection block are controlled by identical selection signals.

4. The integrated circuit according to claim 3 wherein the address decoder comprises:
   an address decoding stage to supply first logic selection signals according to a memory cell address; and
   an adaptation stage to receive a control signal and to supply second logic selection signals that vary according to the first logic selection signals, the second logic selection signals being applied to the first and second sub-blocks of the selection blocks as selection signals, the adaptation stage being arranged for the second selection signals to have a logic value that is opposite of that of the first selection signals when the control signal has a first value and a logic value identical to that of the first selection signals when the control signal has a second value.

5. The integrated circuit according to claim 1 wherein the first device is configured to supply an erase or programming voltage to erase or to program one or more of the memory cells and the transistors of the first type of conductivity are PMOS transistors.

6. The integrated circuit according to claim 1 wherein the second device is configured to supply a read voltage to read one or more of the memory cells and the transistors of the second type of conductivity are NMOS transistors.

7. The integrated circuit according to claim 1 wherein the first device is configured to supply a voltage equal or close to a maximum voltage that a low-voltage MOS transistor can bear, and the transistors of the first type are PMOS transistors.

8. The integrated circuit according to claim 1 wherein the second device is configured to supply a voltage lower than a threshold voltage of a MOS transistor, and the transistors of the second type are NMOS transistors.

9. The integrated circuit according to claim 1, further comprising a memory array in which the memory cells are linked to bit lines, and wherein the memory cell selection circuit is a bit line selection circuit having, for each selectable bit line, a bit line selection block having in parallel said first sub-block to link the bit line to the first device and said second sub-block to link the bit line to the second device, the first sub-block only having transistors of said first type of conductivity, and the second sub-block only having transistors of said second type of conductivity.

10. The integrated circuit according to claim 9 wherein the bit line selection circuit is split into two parts arranged on either side of the memory array, the first part only including the first sub-blocks of the selection blocks and the second part only comprising the second sub-blocks of the selection blocks, the first sub-blocks being linked to first ends of bit lines and the second sub-blocks being linked to second ends of bit lines.

11. The integrated circuit according to claim 1 wherein the first and the second sub-blocks of the one or more selection blocks each only comprise a single transistor.

12. The integrated circuit according to claim 1 wherein the first and the second sub-blocks of the one or more selection blocks each comprise at least two transistors in series.

13. A method for applying to memory cells a first voltage and a second voltage, through a memory cell selection circuit having memory cell selection blocks each having selection transistors, the method comprising:
   providing in each memory cell selection block a first selection sub-block and a second selection sub-block in parallel, the first sub-block only having transistors of a first type of conductivity, and the second sub-block only having transistors of a second type of conductivity;

applying the first voltage to the memory cells through the transistors of the first sub-blocks of the memory cell selection blocks and through one or more additional transistors in series with the transistors of the first sub-blocks and of same type of conductivity as the transistors of the first sub-block; and applying the second voltage to the memory cells through the transistors of the second sub-blocks of the memory cell selection blocks and through one or more additional transistors in series with the transistors of the second sub-block and of same type of conductivity as the transistors of the second sub-block.

14. The method according to claim 13, further comprising applying to gate terminals of the transistors of the first and second sub-blocks of the selection blocks, memory cell selection signals biased such that, when one or more of the memory cells is to be selected, the first sub-block of the selection block for selecting the memory cell is in an ON state and the second sub-block of the selection block is in an OFF state or vice-versa, depending on whether the memory cell is to be linked to the first or to the second voltage.

15. The method according to claim 14, further comprising controlling the first sub-block and the second sub-block of each selection block by using identical selection signals.

16. The method according to claim 15, further comprising:
supplying first logic selection signals according to a memory cell address;
supplying second logic selection signals having a logic value that is opposite of that of the first selection signals or a logic value identical to that of the first selection signals depending on whether the memory cells are to receive the first voltage or the second voltage; and
applying the second selection signals to the first and second sub-blocks of the selection blocks as selection signals.

17. The method according to claim 13 wherein the first voltage is an erase or programming voltage to erase or to program one or more of the memory cells and the transistors of the first type of conductivity are PMOS transistors.

18. The method according to claim 13 wherein the second voltage is a read voltage to read one or more of the memory cells and the transistors of the second type of conductivity are NMOS transistors.

19. The method according to claim 13 wherein the first voltage is equal or close to a maximum voltage that a low-voltage MOS transistor can bear, and the transistors of the first type of conductivity are PMOS transistors.

20. The method according to claim 13 wherein the second voltage is lower than the threshold voltage of a MOS transistor, and the transistors of the second type of conductivity are NMOS transistors.

21. The method according to claim 13, wherein said method is applied to a memory array wherein the memory cells are linked to bit lines, and further comprising:
arranging the first sub-blocks of the selection blocks on one side of the memory array and linking them to first ends of bit lines; and
arranging the second sub-blocks on another side of the memory array and linking them to second ends of bit lines.

22. The method according to claim 13, further comprising providing only a single transistor in the first and the second sub-blocks of the one or more selection blocks.

23. The method according to claim 13, further comprising providing at least two transistors in series in the first and the second sub-blocks of the one or more selection blocks.

24. The method according to claim 13 wherein the first voltage is an erase or programming voltage to erase or to program phase change memory points and the second voltage is a read voltage to read phase change memory points.

25. A system, comprising:
a memory having memory cells;
a memory cell selection circuit coupled to said memory cells and having memory cell selection blocks each including selection transistors;
a first device coupled to said memory cell selection circuit to supply a first voltage to said memory cells;
a second device coupled to said memory cell selection circuit to supply a second voltage to said memory cells;
wherein:
each selection block to select a memory cell includes a first selection sub-block to link the memory cell to the first device and a second selection sub-block to link the memory cell to the second device;
the first sub-block only includes said selection transistors of a first type of conductivity;
the second sub-block only includes said selection transistors of a second type of conductivity different from the first type of conductivity;
each memory cell is linked to the first device by a path having the selection transistors of the first sub-block and at least one transistor coupled to the selection transistors of the first sub-block, and is linked to the second device by a path having the selection transistors of the second sub-block and at least one additional transistor coupled to the selection transistors of the second sub-block; and
the at least one transistor coupled to the selection transistors of the first sub-block is of same type of conductivity as the selection transistors of the first sub-block, and the at least one transistor coupled to the selection transistors of the second sub-block is of same type of conductivity as the selection transistors of the second sub-block.

26. The system of claim 25 wherein said selection transistors are MOS transistors.

27. The system of claim 25, further comprising a memory cell address decoder coupled to said memory cell selection circuit to supply to gate terminals of the selection transistors of the first and second sub-blocks with memory cell selection signals biased such that, when said memory cell is to be selected, the first sub-block is in an ON state and the second sub-block is in an OFF state or vice-versa, depending on whether the memory cell is to be linked to the first or to the second device.

28. The system of claim 25 wherein said memory cells each include a phase change memory point.

29. An integrated circuit having a non-volatile memory, the integrated circuit comprising:
memory cells;
a memory cell selection circuit having memory cell selection blocks each including selection transistors;
a first device to supply a first voltage applicable to said memory cells;
a second device to supply a second voltage applicable to said memory cells;
wherein:
each selection block to select a memory cell includes in parallel a first selection sub-block to link the memory cell to the first device and a second selection sub-block to link the memory cell to the second device;
the first sub-block only includes transistors of a first type of conductivity;
the second sub-block only includes transistors of a second type of conductivity; and the first and the second sub-blocks of the one or more selection blocks each comprise at least two transistors in series.

30. The integrated circuit according to claim 29, further comprising a memory cell address decoder to supply to gate terminals of the transistors of the first and second sub-blocks of the selection blocks with memory cell selection signals biased such that, when one or more of the memory cells is to be selected, the first sub-block of the selection block to select the memory cell is in an ON state and the second sub-block of the selection block is in an OFF state or vice-versa, depending on whether the memory cell is to be linked to the first or to the second device.

31. The integrated circuit according to claim 30 wherein the first sub-block and the second sub-block of each selection block are controlled by identical selection signals.

32. A method for applying to memory cells a first voltage and a second voltage, through a memory cell selection circuit having memory cell selection blocks each having selection transistors, the method comprising:

providing in each memory cell selection block a first selection sub-block and a second selection sub-block in parallel, the first sub-block only having transistors of a first type of conductivity, and the second sub-block only having transistors of a second type of conductivity;

applying the first voltage to the memory cells through the first sub-blocks of the one or more selection blocks;

applying the second voltage to the memory cells through the second sub-blocks of the one or more selection blocks; and providing at least two transistors in series in the first and the second sub-blocks of the one or more selection blocks.

33. The method according to claim 32, further comprising applying to gate terminals of the transistors of the first and second sub-blocks of the selection blocks, memory cell selection signals biased such that, when one or more of the memory cells is to be selected, the first sub-block of the selection block for selecting the memory cell is in an ON state and the second sub-block of the selection block is in an OFF state or vice-versa, depending on whether the memory cell is to be linked to the first or to the second voltage.

34. The method according to claim 33, further comprising controlling the first sub-block and the second sub-block of each selection block by using identical selection signals.

* * * * *